United States Patent [19]

Fischer

[11] Patent Number: 4,996,097
[45] Date of Patent: Feb. 26, 1991

[54] HIGH CAPACITANCE LAMINATES

[75] Inventor: Paul Fischer, Wilmington, Del.

[73] Assignee: W. L. Gore & Associates, Inc., Newark, Del.

[21] Appl. No.: 324,832

[22] Filed: Mar. 16, 1989

[51] Int. Cl.$^5$ .................. B32B 27/00; B32B 27/32
[52] U.S. Cl. .................................. 428/220; 428/422; 428/901
[58] Field of Search .................. 428/422, 901, 220; 524/413

[56] References Cited

U.S. PATENT DOCUMENTS

| | | | |
|---|---|---|---|
| 4,335,180 | 6/1982 | Trant | 428/422 X |
| 4,518,737 | 5/1985 | Trant | 524/413 |
| 4,640,866 | 2/1987 | Suzuki | 428/422 |

Primary Examiner—Thomas J. Herbert
Attorney, Agent, or Firm—Gary A. Samuels

[57] ABSTRACT

High capacitance laminates made of thin films of polytetrafluoroethylene filled with large amounts of dielectric filler, in which the films are plated or clad with conductive material.

7 Claims, 2 Drawing Sheets

HIGH CAPACITANCE LAMINATES

BACKGROUND OF THE INVENTION

1. Field of The Invention

This invention relates to high capacitance laminates made from thin films of polytetrafluoroethylene filled with large amounts of high dielectric filler, in which the films are plated or clad with copper or other conductive foils and sheets.

2. Description of The Prior Art

High dielectric laminates have been known heretofore, as has their use in printed circuit boards, especially boards for use in microwave applications. Laminates of filled polytetrafluoroethylene and clad with copper are of value in these applications because they reduce, at a given frequency, the wavelength travelling along a conductive path on the laminate. Filled polytetrafluoroethylene has advantages in this use in part because it absorbs little moisture (which affects electrical properties), exhibits low loss, and provides a chemically inert, high temperature resistant material.

Filled polytetrafluoroethylene (PTFE) laminates of high dielectric that are clad with copper are disclosed in U.S. Pat. No. 4,518,737, specifically at column 1, line 63 to column 2, line 11. However, such laminates can generally not be made thin enough for many digital printed circuit board applications where thin high dielectric laminates used to increase board capacitance would be of value.

In digital systems, speed of computation is highly valued. To achieve high speed computation, highly integrated, very fast simultaneously switching integrated circuits (IC's) have been developed. To operate properly these IC's reference known ground and power voltages that are required to remain within given ranges. When these IC's switch they require current for a very short duration. This causes a localized drop in voltage on the power plane. Historically, this drop in voltage has been moderated by the use of surface capacitors. These discrete capacitors provide a store of charge that can be fed to the power plane if the voltage begins to drop. As the speed of IC's increases, this becomes an ineffective way to solve this problem. With today's high performance IC's, the duration that current is needed is very short. Discrete capacitors cannot be positioned close enough to the IC and the path made low enough in inductance to satisfy the needs of the IC, therefore, the voltage drops. If this drop, or spike, in voltage is large enough, errors can be generated when the IC references this reduced voltage. Very thin high dielectric laminates used for the power/ground layers (when located in sequential layers) increase the capacitance of the printed wiring board. This increases the density of charge stored for a given voltage differential, reducing the voltage swings relative to a lower capacitance laminate with discrete capacitors caused by the fast switching IC's improving the fidelity of the signal.

However, thin polytetrafluoroethylene films filled with high dielectric material are not ordinarily obtainable. Filled polytetrafluoroethylene films are generally made by calendering. As the films become thinner and thinner in the calendering process, rheological problems causes pinholes or tears in the filled film. Pinholes and tears, of course, cause electrical problems.

It is desirable to provide laminates of a very thin highly filled films of polytetrafluoroethylene of high dielectric constants and conductive metals, such as copper. It is also desirable to provide a printed circuit board that utilizes such a laminate. It is further desirable to use materials of high tensile strength.

SUMMARY OF THE INVENTION

One aspect of the invention is a laminate comprising:
a. A thin film of filled polytetrafluoroethylene that:
 1. contains 25-85 volume percent particulate filler having a high dielectric constant,
 2. has a film thickness of between 0.0001 and 0.005 inches,
 3. is substantially free of visual pinholes, and
 4. has a matrix tensile strength of at least 2600 psi;
b. A film of conductive metal attached to at least one side of the film defined in part a.

Another aspect of the invention is a printed circuit board in which at least one layer of the board is comprised of the laminate defined above.

DETAILED DESCRIPTION OF THE INVENTION

Figure 1:
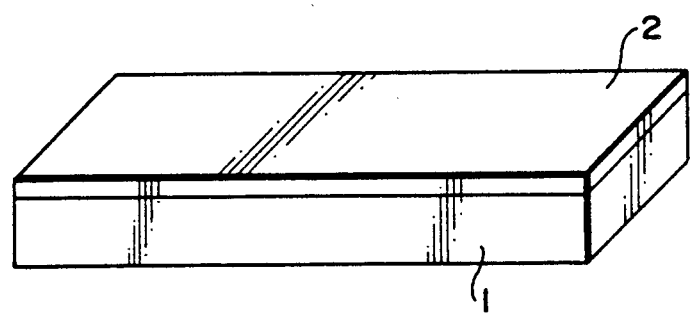
FIG. 1 depicts a laminate of the invention that is copper clad on one side.

The fillers useful herein include any commonly known filler particulate that has a high dielectric constant. By "particulate" is meant individual particles of any aspect ratio and thus includes fibers and powders. Preferably the filler will be smaller than 40 microns and most preferably less than 20 microns average size, and preferably will be titanium dioxide or barium titanate or a ferroelectric complex. Filler concentration in the film will be between about 25-85 volume percent, and the dielectric constant will be at least 7.

In order to obtain the desired degree of thinness, namely between 0.0001 and 0.005 inches, it is preferred to make the filled films by:

(a) mixing 25-85 volume percent particulate filler of an average size of 40 micron or less with polytetrafluoroethylene in aqueous dispersion, (b) cocoagulating the filler and the polytetrafluoroethylene.

(c) lubricating the filled polytetrafluoroethylene with lubricant and paste extruding the lubricated material to form a film, (d) calendering the lubricated film, (e) expanding said film by stretching it so as to form a porous polytetrafluoroethylene having said filler distributed therein, (f) in either order, laminating the conductive metal, and densifying the stretched material by compressing it until the desired thickness is obtained.

By expanding the polytetrafluoroethylene, as described in U.S Pat. No. 3,543,566, to form an expanded porous film comprised of nodes interconnected with fibrils, the filler particles appear to collect around the nodes and thus do not rub or roll to any appreciable extent when subjected to compaction. Thus the expanded, filled PTFE can be densified to form very thin films that are substantially free of pinholes or tears.

Once the thin filled film is obtained, or before densification, as the case may be. a conductive metal, such as copper, is laminated to one or both sides using conventional lamination procedures. The procedure can be a batch procedure such as pressing at 1000 psi, 350° C., under vacuum for two hours or can be a continuous procedure such as is described in U.S. Pat. No. 3,082,292. The copper can be formed into desired circuitry configurations, and the laminate can thus be used as a power/ground layer.

When copper is laminated to both sides, the laminate can be used as a capacitor, thus providing a reservoir of stored charge that supplies charge to areas of the circuitry that become depleted as current is demanded by the IC. By maintaining a high density of charge throughout the circuit board by usage of the laminate of this invention, the voltage spikes that ordinarily occur as the current pulses are reduced, thus improving the fidelity of high speed signals.

By using the laminate of this invention as a distributive capacitor, the need for individual capacitors in the circuit board is reduced or eliminated, thus saving space on the surface of the board.

If desired, an organic polymer, such as a thermoset resin, can be present in the thin film. Presence of such a polymer can lower lamination temperatures and improve adhesion of conductive metal to the film.

In addition, reinforcing fillers can also be present to provide dimensional control. Such fillers can be low dielectric ceramic fillers, such as silicon dioxide.

Figure 2:
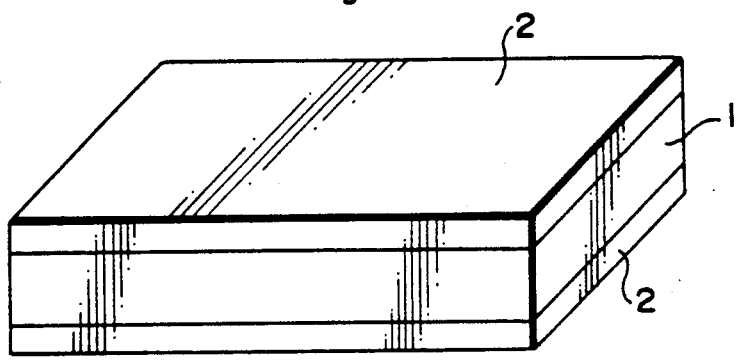
FIG. 2 depicts a laminate of the invention that is copper clad on both sides.

Referring now to the drawings, FIGS. 1 and 2 depict laminates of the invention, where 1 is the layer of filled polytetrafluoroethylene and 2 is a layer of copper on one side of the PTFE film.

Figure 3:
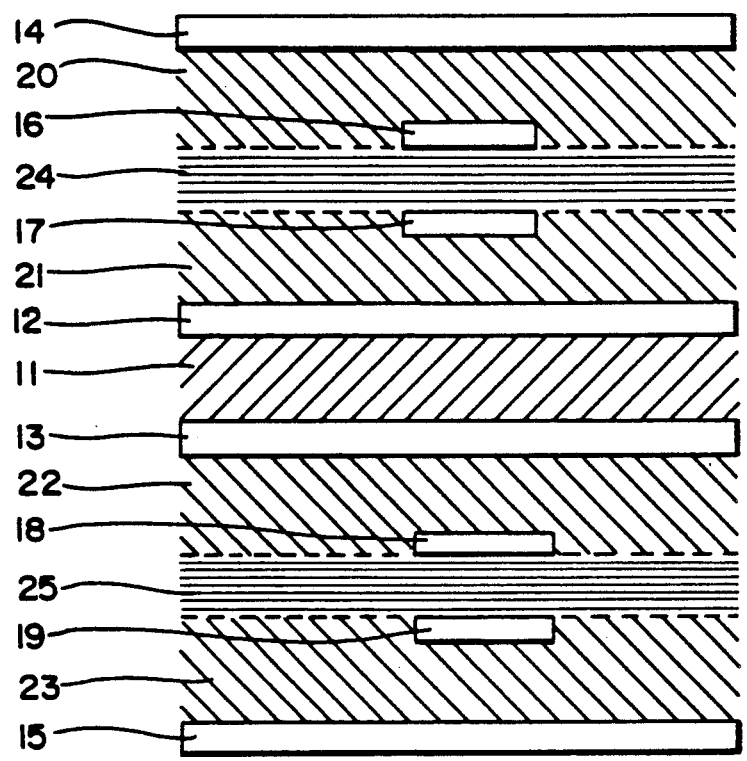
FIG. 3 depicts a printed circuit board of the invention.

FIG. 3 represents a multilayer circuit board where the laminate of the invention is denoted by 10 and comprises high dielectric filled PTFE 11 laminated to copper foils 12 and 13. which are of different voltages, 14 and 15 are copper grounds, 16, 17, 18 and 19 are copper signals, and 20, 21, 22 and 23 are low dielectric insulating material; 24 and 25 represent low dielectric material and can be the same or different from those of layers 20, 21, 22 and 23.

Test Procedures:

Matrix tensile strength testing was carried out on an Instron Model 1122. Samples were one inch wide. Gauge length (distance between clamps) was two inches. Samples were pulled at a rate of 500% per minute. Matrix tensile strength is determined by the following equation:

$$\text{Ultimate Matrix Tensile Strength} = \frac{\rho^I}{\rho^B} \times \frac{TS \text{ } Bulk}{V_I \% \text{ } PTFE}$$

Wherein:
$\rho^I$ = Intrinsic Density
$\rho^B$ = Bulk Density
TS Bulk = Bulk Tensile at Break
$V_I\%$ PTFE = Intrinsic Volume % PTFE

EXAMPLES

EXAMPLE 1

A slurry of 11,866.8 g of Tioxide HPB titanium dioxide and 30 liters of de-ionized $H_2O$ was run through a colloid mill at 0.0025 cm. setting. 13.85 liters of de-ionized water were then added to the slurry under agitation. While the slurry was agitated at 120 rpm, 7,273 g. of polytetrafluoroethylene in a 16.0% solids PTFE dispersion was rapidly poured into the slurry. The PTFE dispersion was obtained from ICI Americas. Co. Within 35 seconds, the co-coagulation was complete. After 10 minutes, the coagulum had settled to the bottom of the mixing vessel and the water was clear.

The coagulum was dried at 160° C. in a convection oven. The material dried in small, cracked cakes approximately 2 cm thick and was chilled to under 10° C. The chilled cake was hand ground using a tight, circular motion and minimal downward force through a 0.635 cm mesh stainless steel screen, then 0.46 cc of polypropylene glycol per gram of powder was added. The mixture was chilled again, passed through a 0.635 cm. mesh screen, tumbled for 10 minutes, then allowed to sit at 18° C. for 48 hours and was retumbled for 10 minutes. It contained 42 volume % filler.

The pellet was then ram extruded in tape form. The extrudate was calendered through heated rolls at a reduction of 25% per pass to 0.057 cm. The material was then stretched transversely 3.5 to 1 with the lubricant still present. The lubricant was evaporated by running the tape across heated rolls. The film was then stretched 5:1 transversely at 295° C. and 133%/sec.

The expanded filled film was then layed up four (4) plies between copper foil and pressed at 1000 psi in a vacuum assisted platem press at a temperature of 350° C. for two (2) hours then cooled under pressure. This resulted in a copper laminate having a dielectric constant of 10 and a 0.0025 inches dielectric film thickness, and a matrix tensile strength of 3500 psi. The capacitance of the laminate is 900 picofarads per square inch.

In general, the laminates of the invention will have a capacitance of greater than 650 picofarads per square inch.

I claim:
1. A laminate comprising:
   (a) a thin film of filled polytetrafluoroethylene that:
      1. contains 25–85 volume percent particulate filler having a high dielectric constant,
      2. has a film thickness of between 0.0001 and 0.005 inches,
      3. is substantially free of visual pinholes, and
      4. has a matrix tensile strength of at least 2600 psi, and
   (b) a film of conductive metal attached to at least one side of the film defined in Part (a).
2. The laminate of claim 1 wherein the laminate has a dielectric constant of at least 7.
3. The laminate of claim 1 where the filler is $TiO_2$ or barium titanate or a ferroelectric complex.
4. A printed circuit board containing a layer of the laminate of claim 1.
5. A laminate of claim 1 having a capacitance of greater than 650 picofarads per square inch.
6. A laminate of claim 1 wherein the break strength is at least 1500 psi.
7. A laminate of claim 1 where the thin film contains a thermoset resin.

* * * * *